(12) United States Patent
Akselrod et al.

(10) Patent No.: US 7,624,360 B2
(45) Date of Patent: Nov. 24, 2009

(54) METHOD FOR FEEDBACK CIRCUIT DESIGN

(75) Inventors: Arkady Akselrod, Santa Clara, CA (US); Sameer G. Kelkar, Santa Clara, CA (US)

(73) Assignee: Power Integrations, Inc., San Jose, CA (US)

( * ) Notice: Subject to any disclaimer, the term of this patent is extended or adjusted under 35 U.S.C. 154(b) by 20 days.

(21) Appl. No.: 11/599,524

(22) Filed: Nov. 13, 2006

(65) Prior Publication Data

US 2008/0115095 A1 May 15, 2008

(51) Int. Cl.
*G06F 17/50* (2006.01)
(52) U.S. Cl. ................... 716/1; 716/4; 703/14
(58) Field of Classification Search .............. 716/4–6, 716/1; 330/250, 265, 294; 323/324; 703/14
See application file for complete search history.

(56) References Cited

U.S. PATENT DOCUMENTS

| | | | | |
|---|---|---|---|---|
| 5,565,672 A | * | 10/1996 | Siegel et al. ............ 250/214 R |
| 5,617,326 A | * | 4/1997 | Yamamoto ................... 703/14 |
| 6,232,834 B1 | * | 5/2001 | Zheng ....................... 330/107 |
| 6,417,739 B1 | * | 7/2002 | Chacko ....................... 331/17 |
| 6,519,538 B1 | * | 2/2003 | Bowman et al. .............. 702/65 |
| 7,248,117 B1 | * | 7/2007 | Li et al. ..................... 330/260 |
| 7,324,354 B2 | * | 1/2008 | Joshi et al. ................... 363/17 |
| 2006/0022657 A1 | * | 2/2006 | Sutardja et al. ............. 323/283 |
| 2006/0238183 A1 | * | 10/2006 | DeVries et al. ............. 323/288 |

* cited by examiner

*Primary Examiner*—Paul Dinh
*Assistant Examiner*—Nha T Nguyen
(74) *Attorney, Agent, or Firm*—Blakely Sokoloff Taylor & Zafman, LLP

(57) ABSTRACT

A method and system for feedback circuit design are disclosed. In one aspect, a method of feedback circuit design includes simulating a reference circuit design having a feedback stage at a target crossover frequency, determining an initial phase margin at the target crossover frequency, and adding an impedance network to the feedback stage if the initial phase margin is less than a threshold phase margin. The design of the impedance network is determined such that the initial phase margin is increased.

25 Claims, 13 Drawing Sheets

▽ Device Variables

| Var | Value | Units | Description |
|---|---|---|---|
| Device | TOP244Y | | PI Device Name |
| PO | 30.07 | Watts | Total Output Power |
| VDRAIN | 642 | Volts | Maximum Drain Voltage |
| VDS | 7.85 | Volts | Drain to Source Voltage |
| FS | 132000 | Hertz | Switching Frequency |
| KRPKDP | 0.75 | | Continuous/Discontinuous Operating Ratio |
| KI | 1.00 | | KI Factor |
| ILIMITEXT | 1.26 | Amps | Device Current Limit External Minimum |
| ILIMITMIN | 1.26 | Amps | Current Limit Minimum |
| ILIMITMAX | 1.45 | Amps | Current Limit Maximum |
| IP | 1.20 | Amps | Peak Primary Current |
| IRMS | 0.61 | Amps | Primary RMS Current |
| DMAX | 0.60 | | Maximum Duty Cycle |
| RLS | 2.0 | MΩ | Line sense resistor |

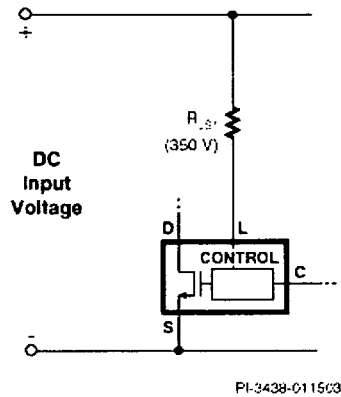

▷ Bias and Clamp Components Section

▽ Transformer Construction Parameters

| Var | Value | Units | Description |
|---|---|---|---|
| Core/Bobbin | E25/13/7 (EF25) | | Core Type |
| Core Manuf. | Generic | | Core Manufacturer |
| Bobbin Manuf | Generic | | Bobbin Manufacturer |
| LP | 384 | µHenries | Primary Inductance |
| NP | 46.3 | | Primary Number of Turns |
| NB | 5.0 | | Bias Winding Number of Turns |
| AWG | 27 | AWG | Primary Wire Gauge |
| CMA | 332 | Cmils/A | Primary Winding Current Capacity |
| VOR | 117.62 | Volts | Reflected Output Voltage |

FIG. 4

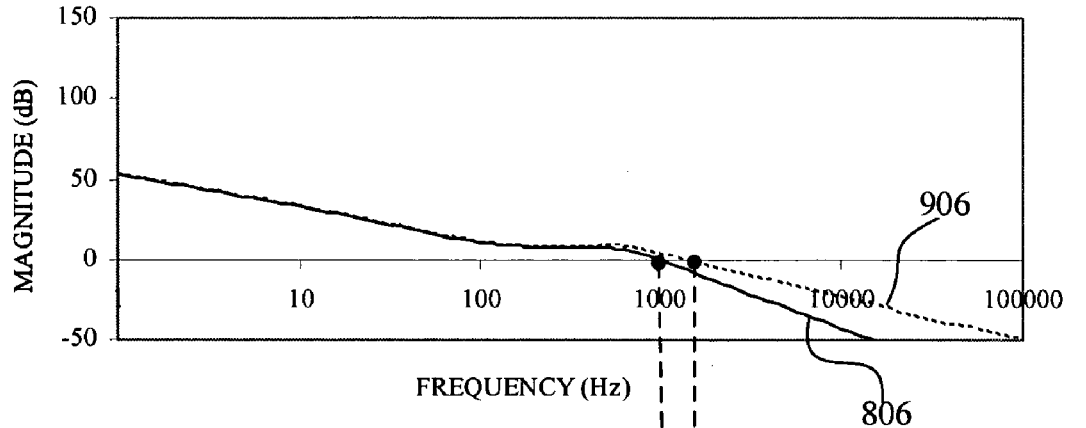
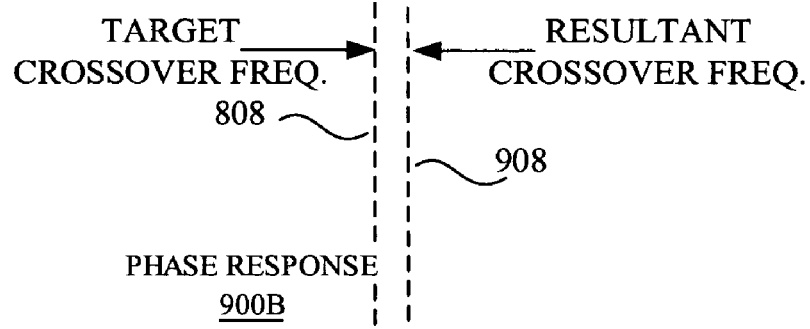
FIG. 9

METHOD FOR FEEDBACK CIRCUIT DESIGN

TECHNICAL FIELD

This disclosure relates generally to the design of circuits, and particularly, relates to the design of feedback circuits.

BACKGROUND INFORMATION

The design of a feedback circuit is one of the more difficult tasks a circuit designer can undertake. In a standard feedback circuit, the designer may adjust components to control the behavior of a system. However, sometimes a feedback circuit includes integrated circuits. These integrated circuits have many, if not hundreds, of internal components. The values of the internal components, as well as the frequency characteristics of these integrated circuits are fixed. This limits the designer's degree of freedom to manipulate the frequency response of the circuit.

One example of this problem exists in the field of power supply design. Power supply circuits sometimes include optocouplers and integrated controllers, switches, and noise filters. The addition of these components greatly restricts the designer's ability to achieve desired frequency characteristics. Furthermore, power components are typically not adjustable due to certain input/output specifications imposed on the designer. While there are known ways to design stable control loops with the above constraints, they typically result in a less than desirable phase margin. Improving the phase margin while maintaining the desired frequency response typically involves a complete redesign of the feedback circuit, resulting in increased time and cost.

BRIEF DESCRIPTION OF THE DRAWINGS

Non-limiting and non-exhaustive embodiments of the disclosure are described with reference to the following figures, wherein like reference numerals refer to like parts throughout the various views unless otherwise specified. The present disclosure detailed is illustrated by way of example and not limitation in the accompanying Figures.

FIG. 4 is a screen shot illustrating a graphical user interface (GUI) window for allowing a user of a CAD tool to input power stage parameters of a reference circuit design, in accordance with the teachings of the present disclosure.

FIG. 9 is a graph illustrating resultant feedback characteristics of a reference circuit design, in accordance with the teachings of the present disclosure.

DETAILED DESCRIPTION

Embodiments of a system and method for feedback circuit design are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment", "an embodiment", "one example", or "an example" means that a particular feature, structure, or characteristic described in connection with the embodiment or example is included in at least one embodiment of the present disclosure. Thus, the appearances of the phrases "in one embodiment", "in an embodiment", "in one example", or "in an example" in various places throughout this specification are not necessarily all referring to the same embodiment or example. Furthermore, the particular features, structures, or characteristics may be combined in any suitable manner in one or more embodiments.

Throughout this specification, several terms of art are used. These terms are to take on their ordinary meaning in the art from which they come, unless specifically defined herein or the context of their use would clearly suggest otherwise. "Phase Margin" is a feedback characteristic defined herein as a measure of the relative stability of a feedback circuit and may, for example, be quantified as the amount of additional phase shift at a crossover frequency that would be required for the circuit to become unstable. In one embodiment, phase margin may be measured as the additional lag in phase measured from −180°. "Crossover Frequency" is a feedback characteristic defined herein as the frequency of an electrical circuit at which the loop gain of the circuit is equal to a predetermined or dynamically determined gain value. In one example, this gain value may represent an approximate gain of one (i.e., 0 dB). "Loop Gain" is defined herein as the total product of the gains (or sum of gains if expressed in dB) of all circuit elements encountered in a complete trip around the control loop of an electrical circuit.

Figure 1:
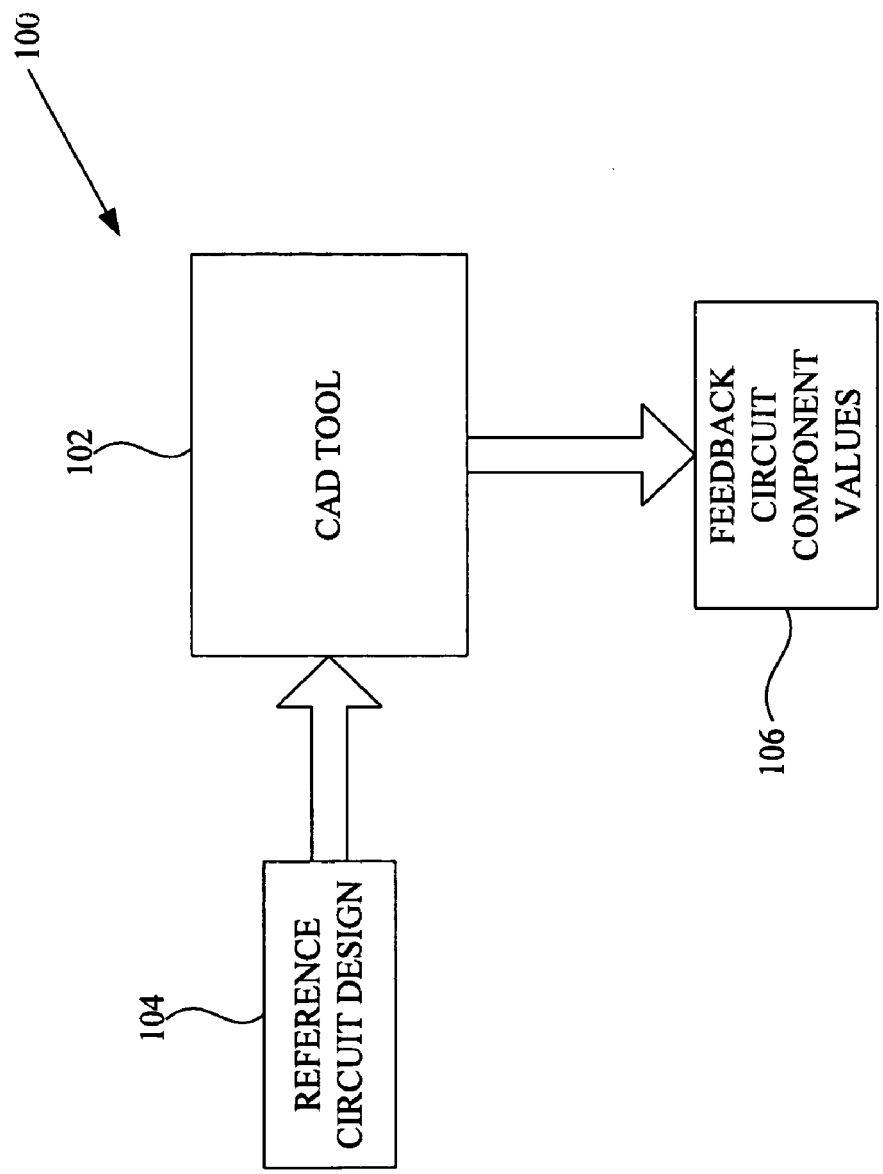
FIG. 1 is a functional block diagram illustrating a software architecture system for determining feedback circuit component values of a reference circuit design, in accordance with the teachings of the present disclosure.

FIG. 1 is a functional block diagram illustrating, generally, an example of a software architecture system 100 for determining feedback circuit component values of a reference circuit design, in accordance with the teachings of the present disclosure. The illustrated example of system 100 includes a computer-aided-design (CAD) tool 102, a reference circuit design 104, and a list of feedback circuit component values 106. In one example, system 100 represents functional blocks that may be included within a computer program such as PI Expert™ power supply design software from Power Integrations of San Jose, Calif. In other examples, it is appreciated that system 100 may be incorporated into other electrical circuit design software programs for designing, simulating, verifying, and testing electrical circuits in accordance with the teachings of the present disclosure.

Reference circuit design 104 represents a description of an electrical circuit having a feedback stage for returning a portion of the circuit's output for comparison to its control input. In one example, reference circuit design 104 may represent a switching regulator-type power supply circuit that includes a feedback stage to regulate the output of the power supply. Reference circuit design 104 may be described using any number of hardware description languages including Very-High-Speed Integrated Circuit Hardware Description Language (VHDL), Verilog, Simulation Program with Integrated Circuits Emphasis (SPICE), HSPICE, PSPICE or the like, at a variety of abstraction levels (e.g., behavior code, Resistor Transistor Logic (RTL), Netlist, layout, etc.)

Reference circuit design 104 includes several power stage components that may be fixed values based on operational parameters. These power stage components are pre-calculated either manually or through a CAD tool like PI Expert™ power supply design software from Power Integrations of San Jose, Calif., to generate a reference circuit design. The feedback stage components from reference circuit design 104 and the target feedback characteristics are loaded into CAD tool 102. A graph of the feedback characteristics is generated by CAD tool 102. The phase margin is calculated to determine if the phase margin is above a threshold phase margin. If the phase margin is below the threshold phase margin, CAD tool 102 adds an impedance network (i.e., phase boost) to reference circuit design 104 to further increase the phase margin. However, in calculating the values of impedance components, CAD tool 102 takes care as to increase phase margin while reducing the effects that the newly added impedance network will have on the magnitude response characteristics of reference circuit design 104. CAD tool 102 then outputs the calculated feedback circuit component values 106. When the phase margin is above the threshold, CAD tool 102 outputs the calculated feedback circuit component values 106.

In one example, CAD tool 102 may further output characteristics of reference circuit design 104, such as, but not limited to, the actual crossover frequency and phase margin, a resultant phase response curve, and a resultant magnitude response curve. A user of system 100 has the option to make manual adjustments to component values of the reference circuit design by hand and cause CAD tool 102 to generate new feedback circuit component values 106 of reference circuit design 104.

Figure 2A:
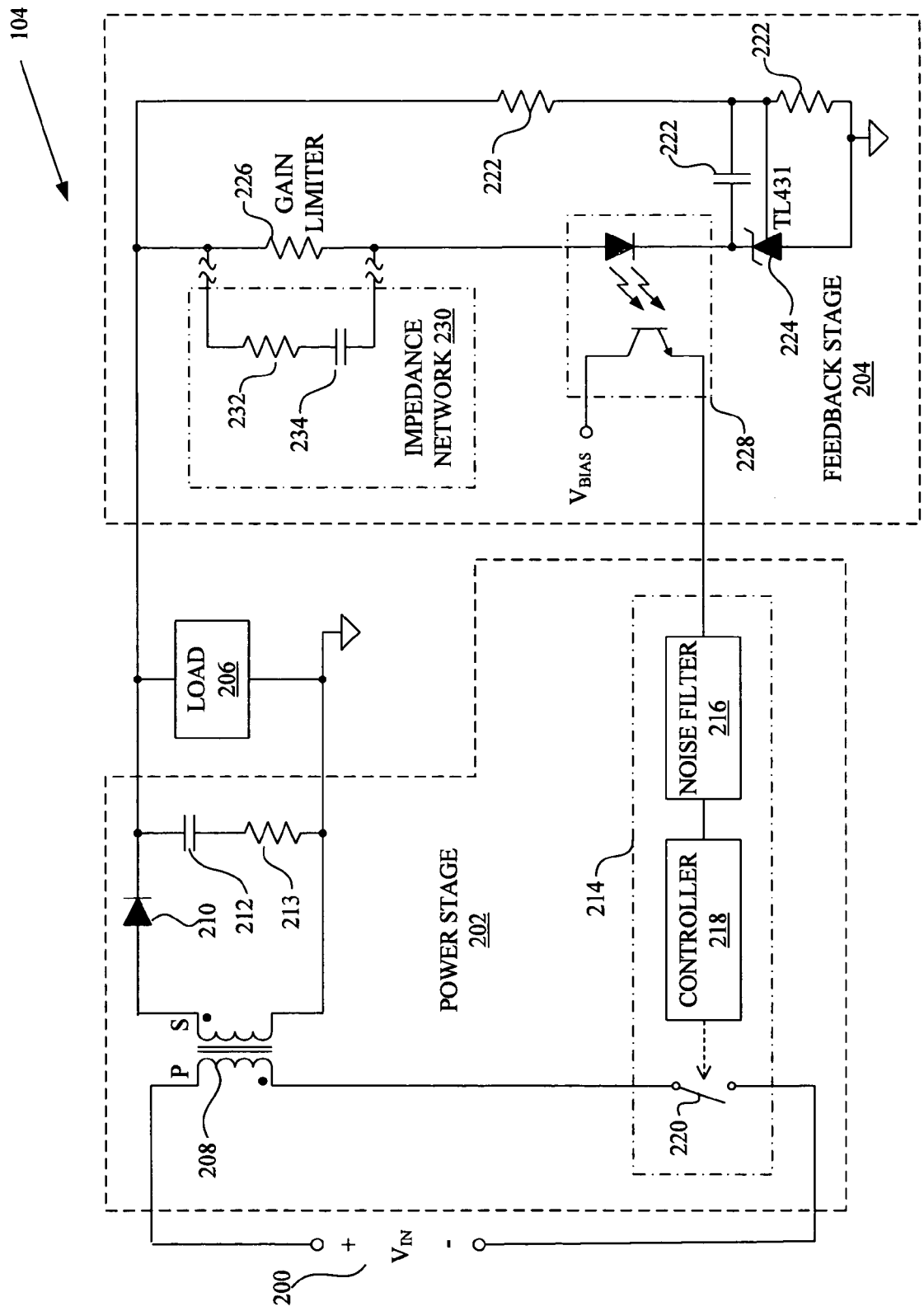
FIG. 2A is a circuit diagram illustrating a reference circuit design, in accordance with the teachings of the present disclosure.

FIG. 2A is a circuit diagram illustrating an example reference circuit design 104, in accordance with the teachings of the present disclosure. The illustrated example of reference circuit design 104 includes an unregulated input voltage 200, a power stage 202, a feedback stage 204, and a load 206. In the illustrated example, power stage 202 includes an energy transfer element 208, a rectifier 210, a filter 212, an effective series resistance 213, and a power supply controller 214 having a noise filter 216, controller 218, and a switch 220. The illustrated example of feedback stage 204 includes feedback components 222, a shunt regulator 224, a gain limiter 226, an optocoupler 228, and a phase boost impedance network 230, including impedance components 232 and 234. It should be appreciated that impedance network 230 may not be initially present in reference circuit design 104 and, instead, may be subsequently added to the design in accordance with the processes described infra.

The reference circuit design 104 of FIG. 2A depicts one particular regulated power supply topology for the purpose of clarity in teaching embodiments of the present disclosure. However, one of ordinary skill in the art having the benefit of the present disclosure should recognize that the teachings of the present disclosure may be employed with various other types of circuit topologies that include feedback for monitoring and, if necessary, control of an output signal.

Power stage 202 is coupled to provide output power to load 206 from unregulated input voltage 200. Feedback stage 204 is coupled to provide a feedback signal to power stage 202, such that power stage 202 may output a substantially constant current or voltage at load 206.

Power stage 202 includes energy transfer element 208 having a primary side and a secondary side. Although FIG. 2A illustrates energy transfer element 208 as a transformer with two windings, it is appreciated that any device that transfers energy from one or more circuits to one or more other circuits may be implemented, including, for example, a transformer with more than two windings to provide power to additional loads, to provide bias voltages, or to sense voltages at a load. One end of the primary side of energy transfer element 208 is coupled to unregulated input voltage 200. The other end of the primary side is coupled to power supply controller 214. In one example, power supply controller 214 is from the TOPSwitch® family of integrated circuit power supply controllers from Power Integrations of San Jose, Calif. In other examples, other power supply controllers may be utilized in power supply designs in accordance with the teachings of the present disclosure. Embedded in power supply controller 214 is noise filter 216 to receive and condition a feedback signal received from feedback stage 204. Also, embedded in power supply controller 214 is controller 218 to activate switch 220. By way of example, switch 220 may be a transistor, such as, a power metal oxide semiconductor field effect transistor (MOSFET). In operation, switch 220 is switched on and off by controller 218 to control or regulate the transfer of energy in energy transfer element 208 from its primary side to its secondary side.

The secondary side of energy transfer element 208 is coupled to rectifier 210. As a result of the switching of switch 220, rectifier 210 outputs a pulsating current that is filtered by filter 212 to produce a substantially constant (i.e., average) voltage or current at load 206.

Feedback stage 204 is coupled to provide a feedback signal to power stage 202, such that power stage 202 may output a substantially constant current or voltage at load 206. A feedback current proportional to output voltage flows through optocoupler 228. Gain limiter 226 is coupled to optocoupler 228 to reduce a loop gain of circuit design 104 while leaving a phase response of circuit design 104 substantially unaffected. Although gain limiter 226 is illustrated in FIG. 2 as a resistor coupled in series with optical coupler 228, one of ordinary skill in the art with the benefit of the present disclosure should recognize that various other circuit components may be implemented to limit the loop gain of circuit design 104. Although the illustrated reference circuit design 104 includes a particular arrangement and selection of a shunt regulator 224, one of ordinary skill having the benefit of the present disclosure should recognize that any active or passive feedback components may be utilized.

Impedance network 230 is illustrated in FIG. 2A as coupled to gain limiter 226. Although FIG. 2A shows impedance network 230 as a resistor-capacitor (RC) network coupled in parallel to gain limiter 226, it is appreciated that any other circuit components and configuration may be utilized such as to increase the phase margin of circuit design 104 while reducing the effect impedance network 230 has on the magnitude response of circuit design 104.

Figure 2B:
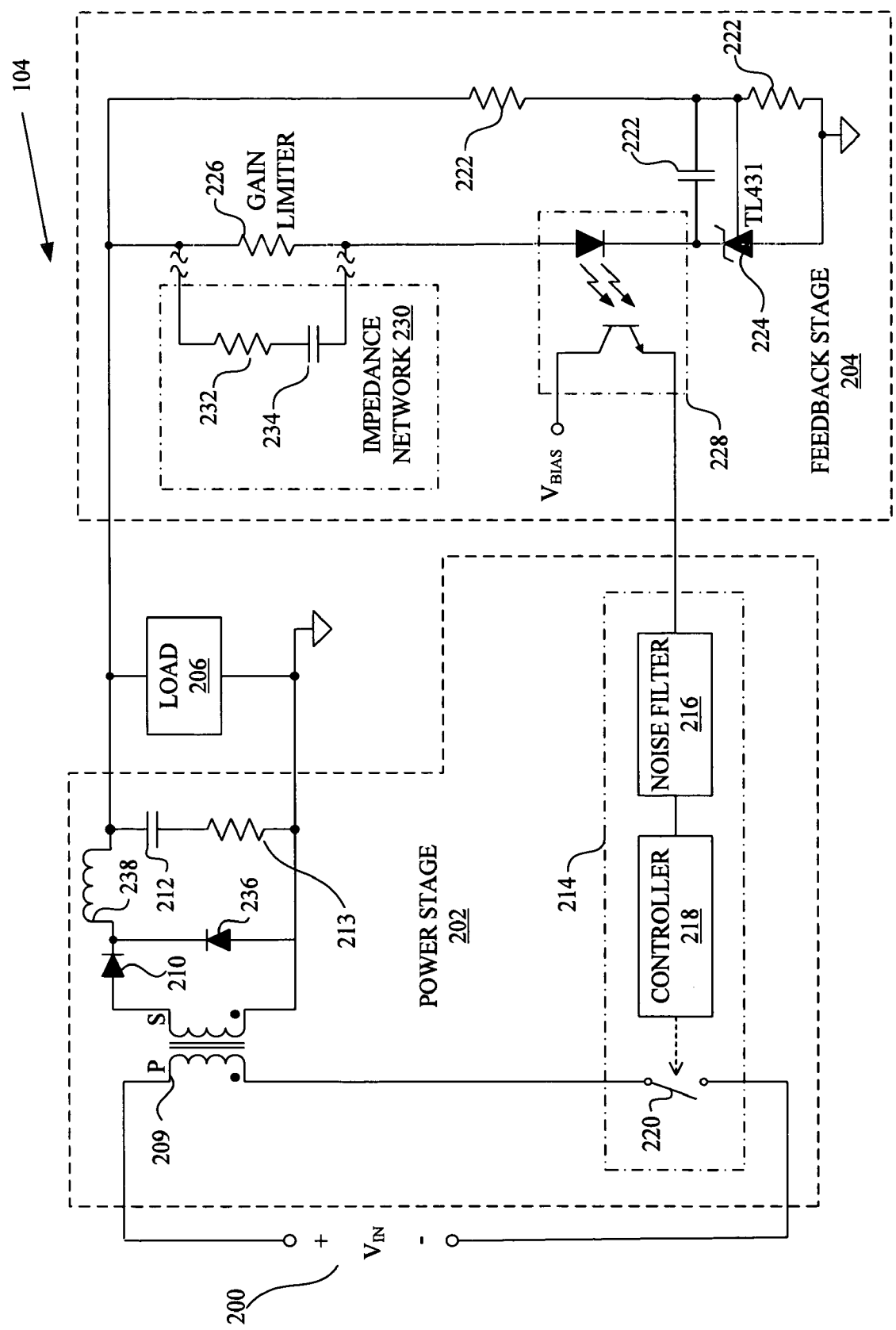
FIG. 2B is a circuit diagram illustrating an alternative configuration of a reference circuit design, in accordance with the teachings of the present disclosure.

Various other types of circuit topologies that include feedback may be utilized with embodiments of the present disclosure. For example, FIG. 2B is a circuit diagram illustrating an alternative configuration of a reference circuit design 104, in accordance with the teachings of the present disclosure. The example reference circuit design 104 illustrated in FIG. 2B includes energy transfer element 209 and additional power stage components: diode 236 and inductor 238.

Figure 2C:
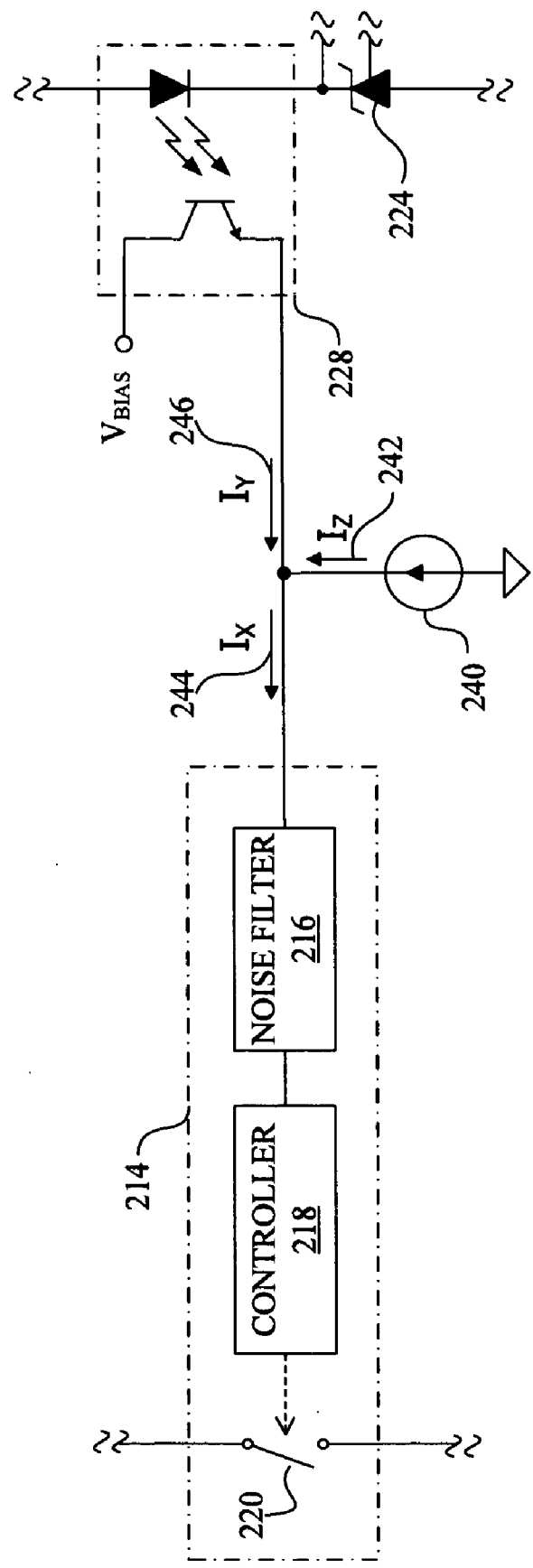
FIG. 2C is a functional circuit diagram illustrating a loop gain concept, in accordance with the teachings of the present disclosure.

FIG. 2C is a functional circuit diagram illustrating a loop gain concept, in accordance with the teachings of the present disclosure. A current source 240 is attached to the reference circuit 104. When current source 240 injects an $I_Z$ current 242 into the reference circuit 104 then a forward $I_X$ current 244 may not be equal to a return $I_Y$ current 246. In this case, the loop gain is defined as the ratio of return $I_Y$ current 246 to the forward $I_X$ current 244 as shown below:

$$T = \frac{I_Y}{I_X}, \qquad \text{EQ. 1}$$

where T represents the loop gain. Feedback circuit component values 106 are designed to control the loop gain in a way to prevent the system from becoming unstable and to provide a desirable transient behavior.

Figure 3:
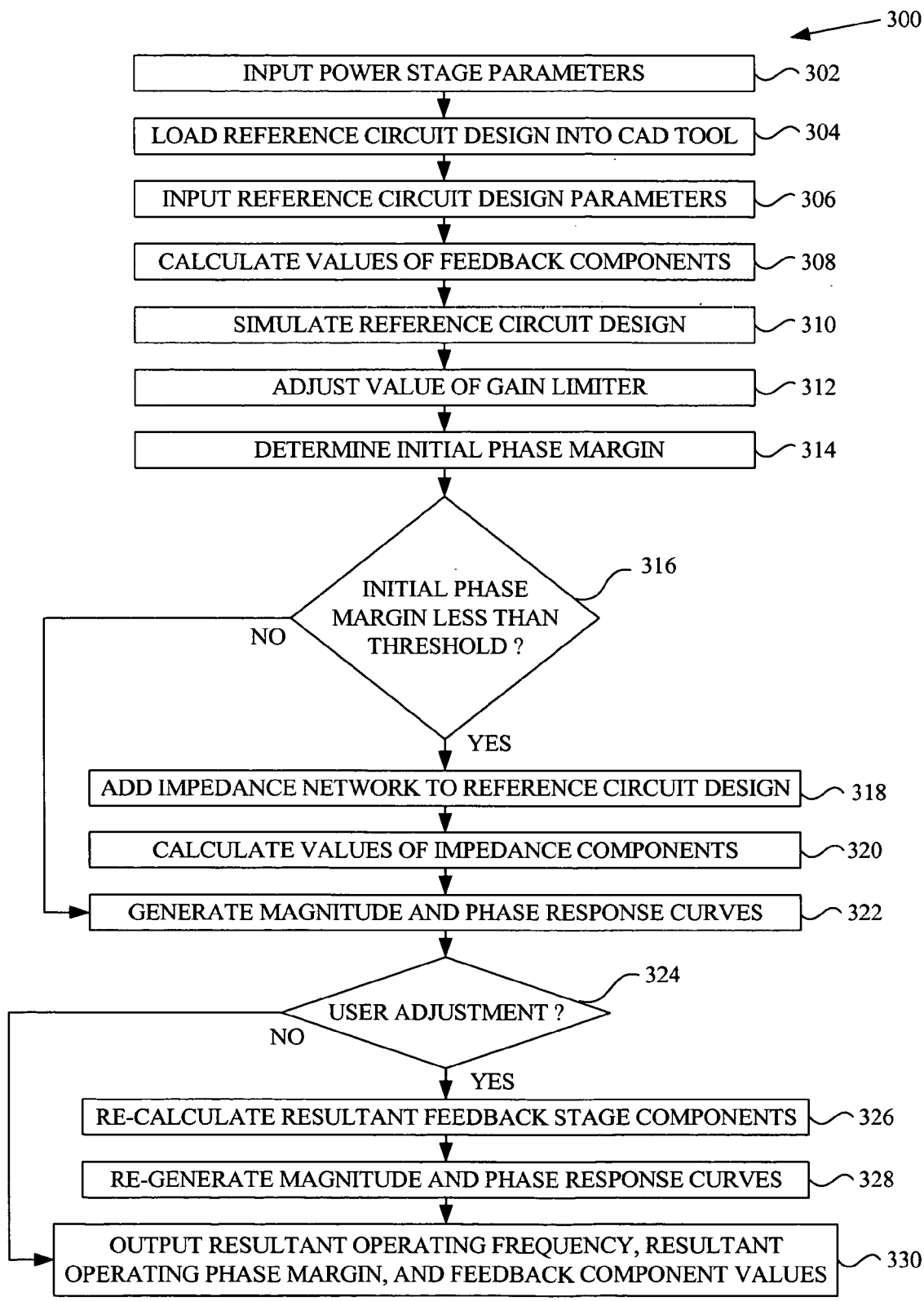
FIG. 3 is a flow chart illustrating an example process for determining feedback circuit component values to achieve desired feedback characteristics of a reference circuit design using a computer aided design (CAD) tool, in accordance with the teachings of the present disclosure.

FIG. 3 is a flow chart illustrating an example process 300 for determining feedback circuit component values to achieve desired feedback characteristics of a reference circuit design using a computer aided design (CAD) tool, in accordance with the teachings of the present disclosure. Process 300 is described with reference to FIGS. 1-10. The order in which some or all of the process blocks appear in process 300 should not be deemed limiting. Rather, one of ordinary skill in the art having the benefit of the present disclosure will understand that some of the process blocks may be executed in a variety of orders not illustrated herein.

In a process block 302, power stage parameters of reference circuit design 104 are input into CAD tool 102. The values for the power stage parameters are typically fixed values that are used to generate reference circuit design 104. By way of example, power stage parameters may include a capacitance value that corresponds with filter 212, a resistance value that corresponds with effective series resistor 213, a duty cycle that corresponds with controller 218, and an inductance value that corresponds with inductor 238.

FIG. 4 is a screen shot illustrating a GUI window 400 for allowing a user of a CAD tool to input power stage parameters of a reference circuit design, in accordance with the teachings of the present disclosure. GUI window 400 may be generated by a software circuit design tool such as, PI Expert™ power supply design software from Power Integrations of San Jose, Calif., based on power stage parameters. In one example, the software circuit design tool may be used to generate reference circuit design 104. In addition, GUI window 800 may graphically display all or a portion of the generated reference circuit design 104.

In a process block 304, reference circuit design 104 is loaded into CAD tool 102. In one example, a software circuit design tool executed on a computer is run prior to process block 304 such that reference circuit design 104 is generated by the software circuit design tool. Software circuit design tool may be, for example, a computer program such as PI Expert™ power supply design software from Power Integrations of San Jose, Calif. In one example, the generated reference circuit design 104 is stored on a computer-readable medium. In another example, the generated reference circuit design 104 may be output from a computer via a printer, an input/output controller, or a display. In one example, process 300 may be performed with CAD tool 102 executed by the same or a different computer that executes the software circuit design tool program that generated reference circuit design 104 in accordance with the teachings of the present disclosure.

Figure 5:
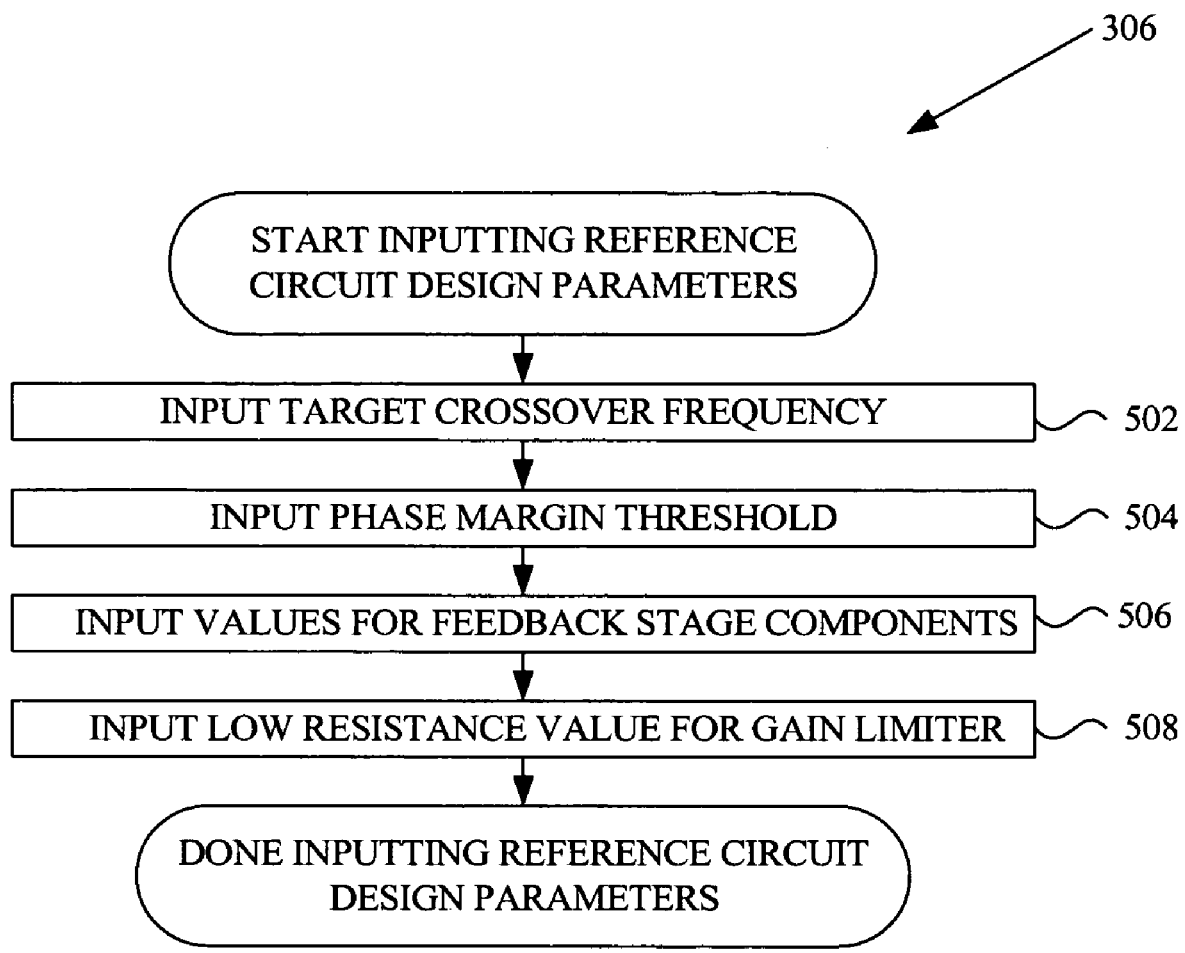
FIG. 5 is a flow chart illustrating an example process for inputting reference circuit design parameters, in accordance with the teachings of the present disclosure.

In a process block 306, reference circuit design parameters are input into CAD tool 102. FIG. 5 is a flow chart expanding process block 306 for inputting reference circuit design parameters, in accordance with the teachings of the present disclosure.

In a process block 502, a target crossover frequency is input into CAD tool 102. In a process block 504, a phase margin threshold is input into CAD tool 102. In one example, the phase margin threshold is set by CAD tool 102 prior to process block 504. In a process block 506, values for feedback stage components are input into CAD tool 102. Values for the feedback stage components may include feedback components 222, a current transfer ratio (C.T.R.) that corresponds with optocoupler 228, and a gain of an error amplifier that corresponds with shunt regulator 224. Typically, feedback components 222 are not used as input values in order to allow for greater design flexibility of reference circuit design 104. However, in certain circumstances certain values for feedback components 222 may be input as parameters for reference circuit design 104. In a process block 508, a resistance value for gain limiter 226 is inputted into CAD tool 102. In one example, the resistance value for gain limiter 226 is a substantially low or high resistance value. A substantially low or high resistance value may be defined as a resistance value that will result in a crossover frequency that is greater than or less than, respectively, the target crossover frequency.

Figure 6:
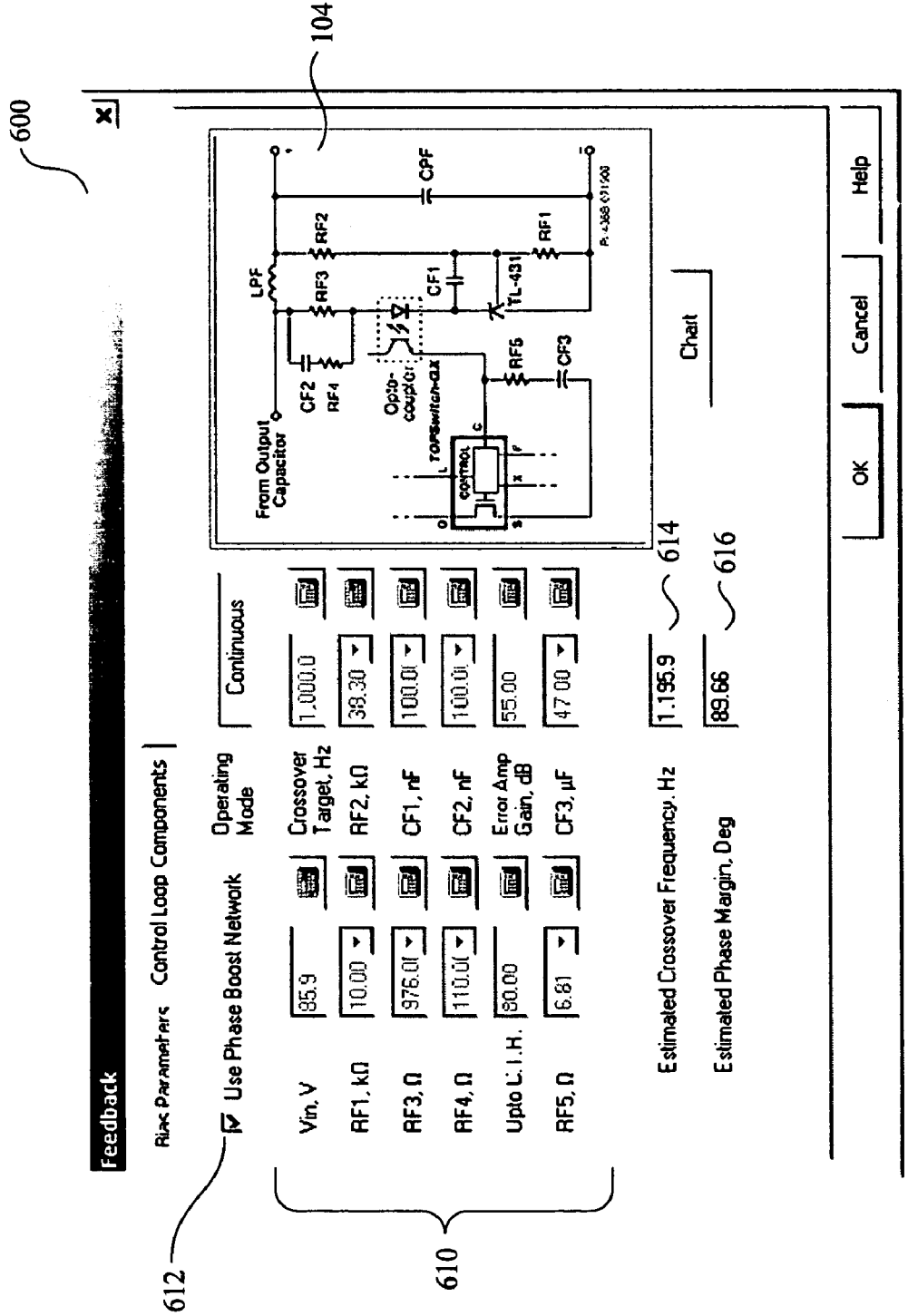
FIG. 6 is a screen shot illustrating a GUI window for allowing a user of a CAD tool to input circuit parameters of a reference circuit design, in accordance with the teachings of the present disclosure.

FIG. 6 is a screen shot illustrating an example of GUI window 600 for allowing a user of CAD tool 102 to input circuit parameters of reference circuit design 104, in accordance with the teachings of the disclosure. GUI window 600 is communicatively coupled to CAD tool 102 to allow a user to input feedback component parameters 610. In one example, the user may input one or more component parameters 610 and GUI window 600 will display the values of the remaining parameters calculated by CAD tool 102, in accordance with the teachings of the present disclosure. The illustrated example of GUI window 600 also graphically displays all or a portion of reference circuit design 104. In one example, GUI window 600 allows a user to enable/disable use of impedance network 230 via user selectable control 612.

Referring, now, back to FIG. 3, in a process block 308, CAD tool 102 calculates values of feedback components 222 that were not set as input parameters in process block 306. Next, in a process block 310, CAD tool 102 simulates reference circuit design 104 based on the inputted design parameters from process blocks 302 and 306 and the calculated values of feedback components 222 from process block 308.

Figure 8:
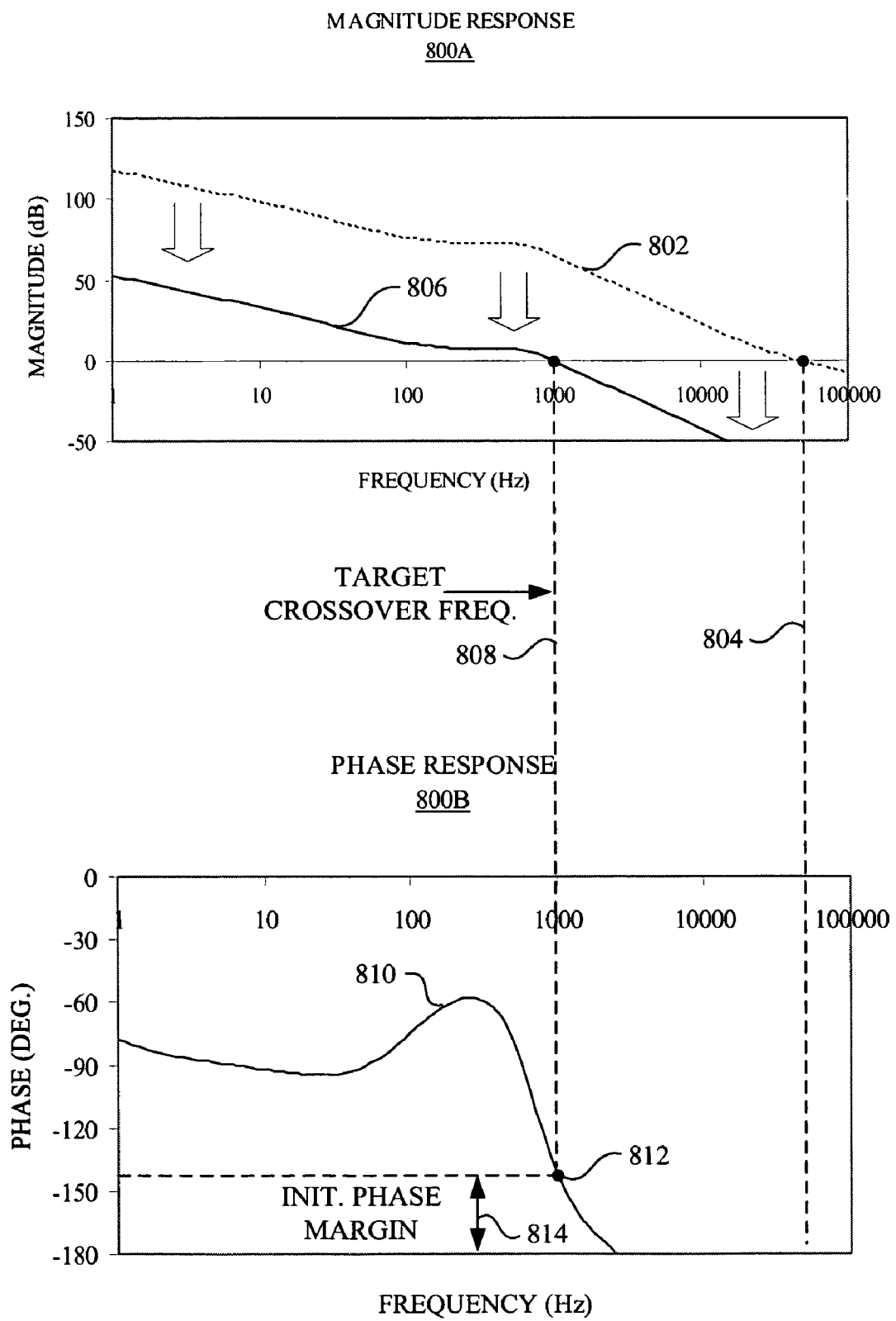
FIG. 8 is a graph illustrating feedback characteristics of a reference circuit design, in accordance with the teachings of the present disclosure.

In simulating reference circuit design 104, CAD tool 102 may graph feedback characteristics of reference circuit design 104. These graphs may include, but are not limited to, an initial magnitude response curve and an initial phase response curve. FIG. 8 is a graph illustrating an initial magnitude response curve 802 and an initial phase response curve 810 of reference circuit design 104, in accordance with the teachings of the present disclosure. As mention above, in the illustrated example, an initial crossover frequency 804 is much greater than a target crossover frequency 808.

Figure 7:
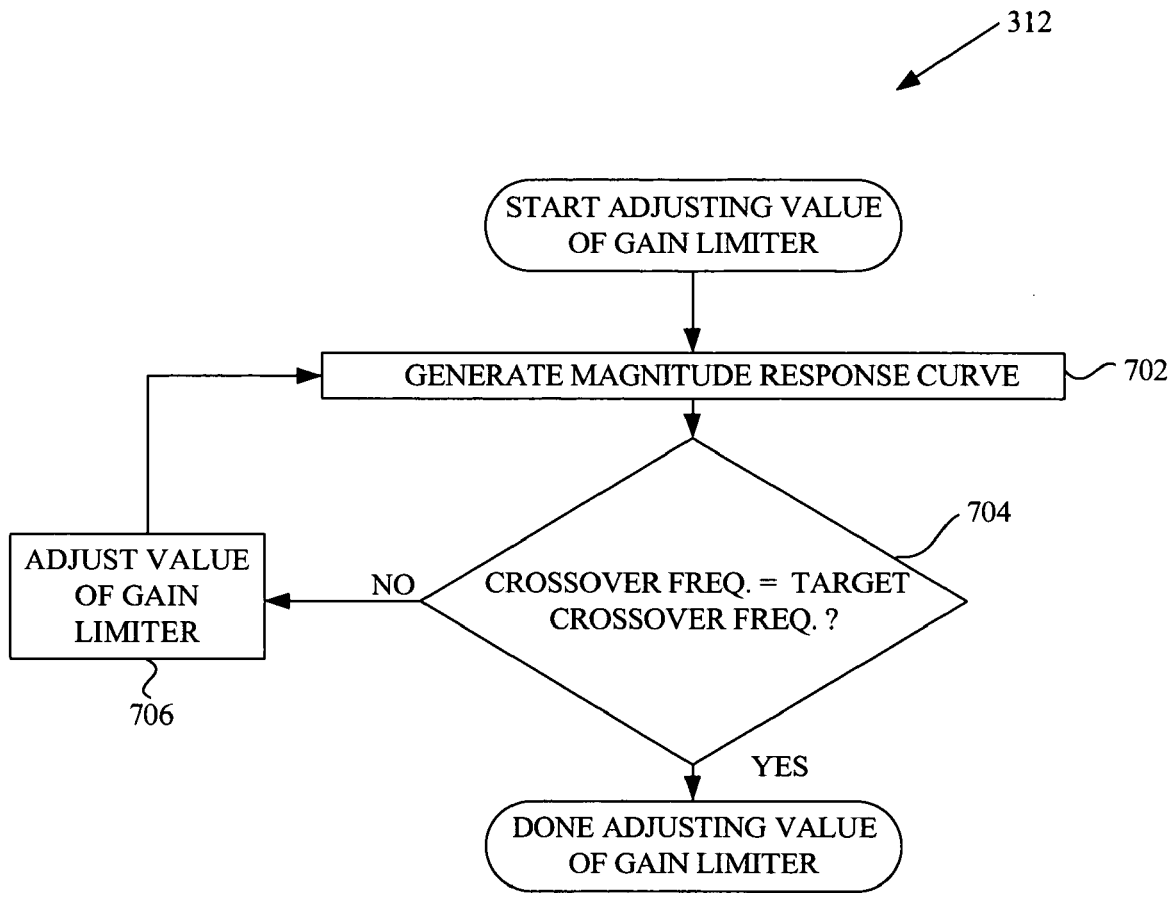
FIG. 7 is a flow chart illustrating an example process for adjusting a value of a gain limiter of a reference circuit design using a CAD tool, in accordance with the teachings of the present disclosure.

In a process block 312, CAD tool 102 adjusts the resistance value of gain limiter 226. FIG. 7 is a flow chart expanding process block 312 for adjusting a value of a gain limiter of reference circuit design 104 using a CAD tool, in accordance with the teachings of the present disclosure. In a process block 702, CAD tool 102 generates a magnitude response curve, such as initial magnitude response curve 802, of FIG. 8. Next, in a decision block 704, CAD tool 102 determines an initial crossover frequency 804 of generated magnitude response curve 802. If initial crossover frequency 804 is equal to target crossover frequency 808 then process block 310 is complete. If it is not equal to target crossover frequency 808, then CAD tool 102 adjusts (i.e., increases or decreases) the value of gain limiter 226, such that magnitude response curve 802 translates towards a translated magnitude response curve 806 with a crossover frequency substantially equal to target crossover frequency 808. For example, gain limiter 226 may initially be set at a substantially low resistance value (i.e., 1Ω), resulting in initial magnitude response curve 802. As CAD tool 102 increases the resistance of gain limiter 226, initial magnitude response curve 802 translates downward such that initial crossover frequency 804 approaches target crossover frequency 808.

Since gain limiter 226 is substantially resistive, the initial phase response curve is substantially unaffected. Therefore, translated magnitude response curve 806 still corresponds to initial phase response curve 810.

Next, in a process block 314, CAD tool 102 determines an initial phase margin 814 based on the initial phase response curve 810 and its phase 812 at target crossover frequency 808. In a decision block 316, the initial phase margin is compared with a threshold phase margin. If the initial phase margin is less than the threshold phase margin, then reference circuit design 104 is deemed insufficient and control proceeds to process block 318. In one example, threshold phase margin may be equal to approximately 45°, where phase margin is the difference between a phase at a crossover frequency and −180°.

In a process block 318, impedance network 230 is added to reference circuit design 104 to increase initial phase margin 814 while reducing the effect impedance network 230 has on translated magnitude response curve 806. In one example impedance network 230 may include a resistor-capacitor network coupled in parallel (e.g., shunting) to gain limiter 226. Addition of impedance network 230 produces a resultant phase response curve 910 and a resultant magnitude response curve 906, as shown in FIG. 9. As can be seen, resultant magnitude response curve 906 differs very little from translated magnitude response curve 806, at least at frequencies up until target crossover frequency 808. Inclusion of impedance network 230 may, however, produce a resultant crossover frequency 908 which is proximate, yet different than target crossover frequency 808.

Whereas resultant magnitude response curve 906 changes little with the addition of impedance network 230, resultant phase margin 914 increases. In one example, the impedance components of impedance network 230 are chosen such that a resultant phase curve 910 at resultant crossover frequency 908 is increased towards −90°.

Next, in a process block 320, CAD tool 102 calculates the values of the impedance components added in process block 318. In one example, calculating the values of impedance components includes determining a transfer function of reference circuit design 104. CAD tool 102 then calculates the values of the impedance components such that a zero is added to the transfer function substantially at target crossover frequency 808 and a pole is added to the transfer function at least one decade higher than the initial crossover frequency. In the illustrated example of FIG. 2, the resistance of impedance component 232 may be calculated as:

$$\frac{R_{GAIN}}{9}, \qquad \text{EQ. 2}$$

where $R_{GAIN}$ is equal to the resistance value of gain limiter 226. Also, the capacitance of impedance component 234 may be calculated as:

$$\frac{9}{20 \cdot \pi \cdot R_{GAIN} \cdot f_{CROSSOVER}}, \qquad \text{EQ. 3}$$

where $R_{GAIN}$ is equal to the resistance value of gain limiter 226 and $f_{CROSSOVER}$ is equal to the crossover frequency of reference circuit design 104.

Figure 10:
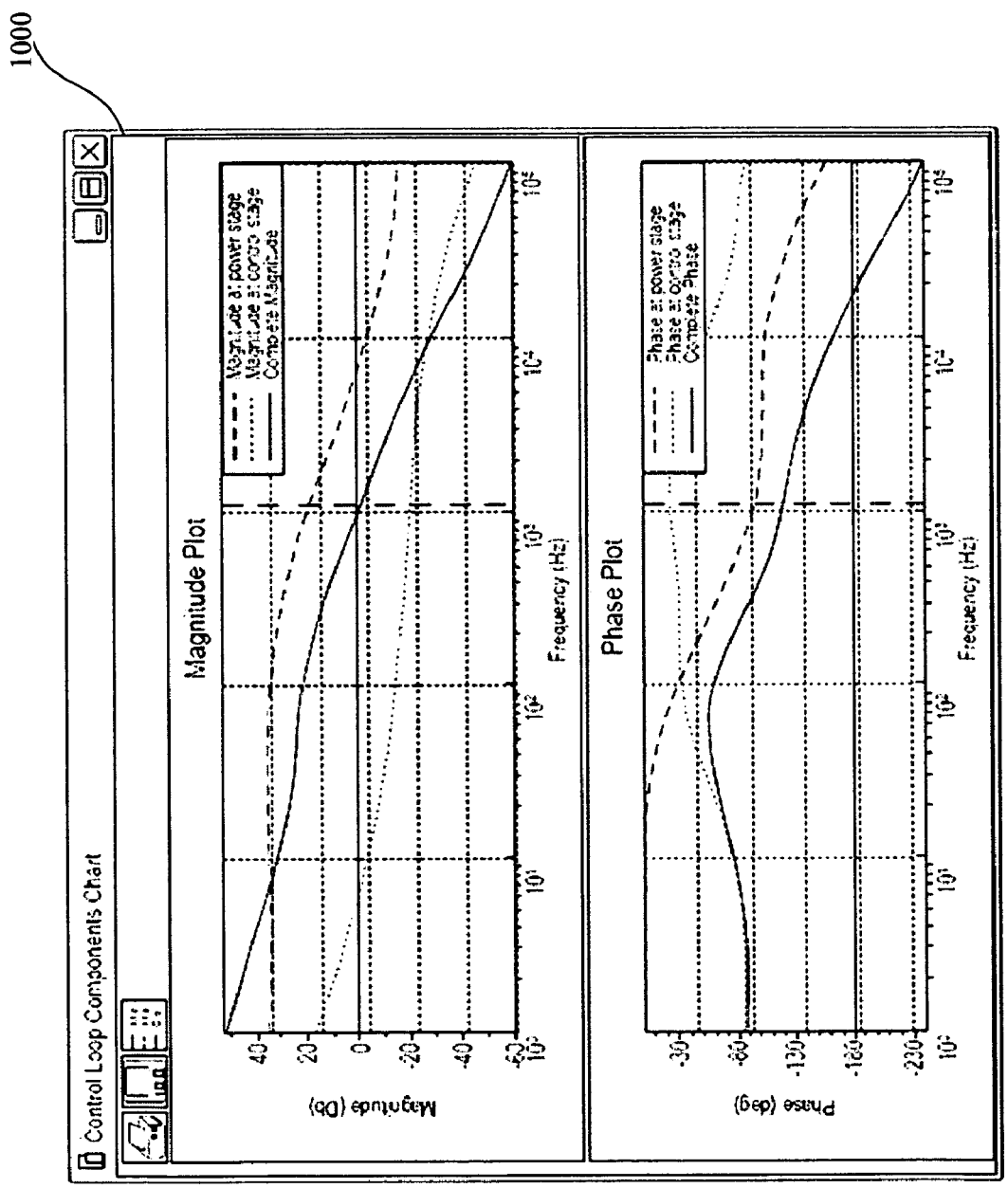
FIG. 10 is a screen shot illustrating a GUI window for displaying the resultant feedback characteristics of a reference circuit design, in accordance with the teachings of the present disclosure.

Once process blocks 318 and 320 are complete (or if the result of decision block 316 was NO), process 300 then proceeds to a process block 322. In process block 322 the resultant magnitude and phase response curves 906 and 910, respectively, are generated. FIG. 10 is a screen shot illustrating a GUI window 1000 for displaying the resultant feedback characteristics of a reference circuit design, in accordance with the teachings of the present disclosure. In one example, CAD tool 102 instantiates GUI window 1000 that displays the respective loop gain or phase for the power stage only, the feedback stage (e.g. control stage) only, or for the entire reference circuit design 104.

In a decision block 324, CAD tool 102 allows the user to make manual changes to the component values of reference circuit design 104. If there is a user adjustment in block 324, control proceeds to a process block 326, where CAD tool 102 re-calculates feedback stage components. Next, in a process block 328, CAD tool 102 re-generates the resultant feedback characteristics (i.e., magnitude and phase response curves, etc.).

In a process block 330, CAD tool 102 outputs the resultant crossover frequency, the resultant phase margin and calculated feedback component values. As shown in FIG. 6, GUI window 600 includes an output 614 for displaying a resultant crossover frequency of reference circuit design 104. GUI window 600 may also include an output 616 for displaying a resultant phase margin of reference circuit design 104. Also, CAD tool 102 updates circuit design parameters 610 to reflect the calculated component values.

Figure 11:
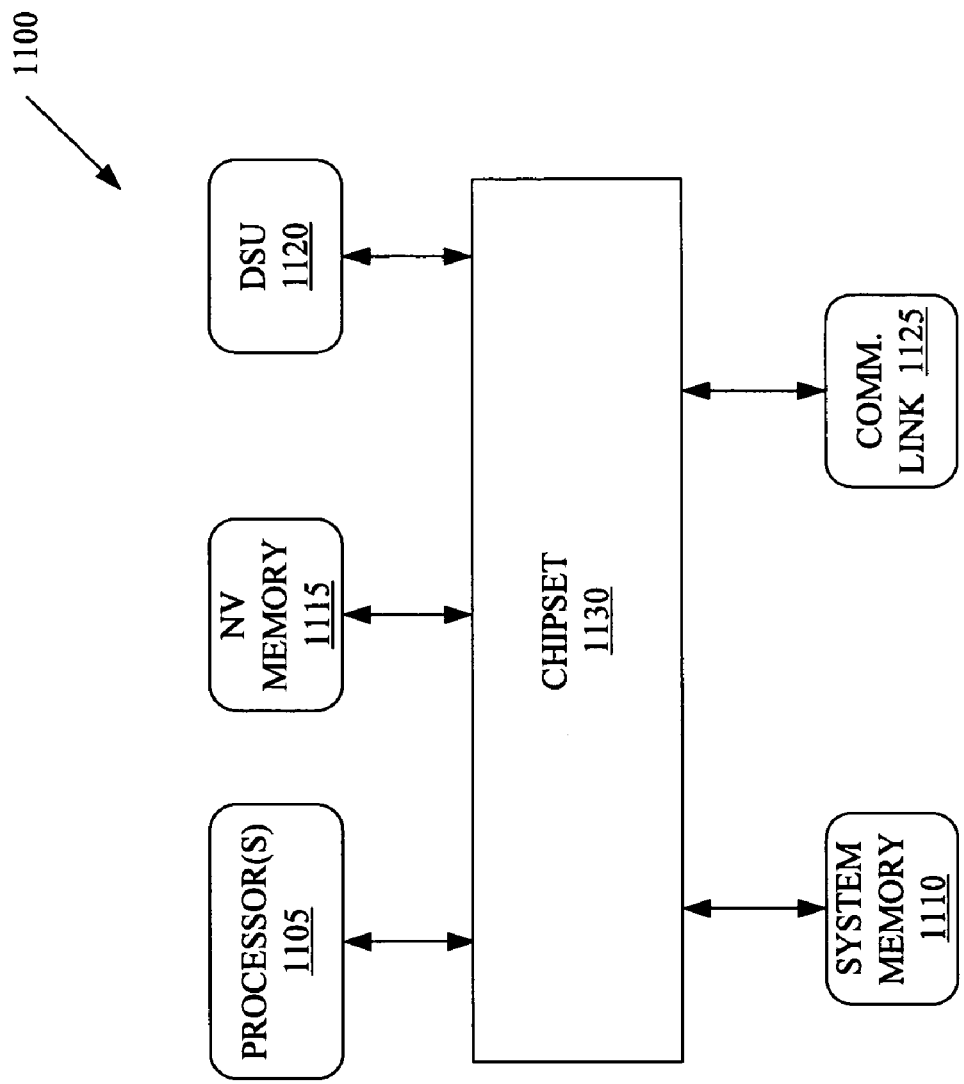
FIG. 11 is a block diagram illustrating a demonstrative processing system for storing and executing embodiments of the present disclosure.

FIG. 11 is a block diagram illustrating a demonstrative processing system 1100 for executing any of CAD tool 102, process 300, GUI window 400, GUI window 600 and GUI window 1000. The illustrated example of processing system 1100 includes one or more processors (or central processing units) 1105, system memory 1110, nonvolatile (NV) memory 1115, a data storage unit (DSU) 1120, a communication link 1125, and a chipset 1130. The illustrated processing system 1100 may represent a computing system including a desktop computer, a notebook computer, a workstation, a handheld computer, a server, a blade server, or the like.

The elements of processing system 1100 are interconnected as follows. Processor(s) 11 05 is communicatively coupled to system memory 1110, NV memory 1115, DSU 1120, and communication link 1125, via chipset 1130 to send and to receive instructions or data thereto/therefrom. In one example, NV memory 1115 is a flash memory device. In other examples, NV memory 1115 includes any one of read only memory (ROM), programmable ROM, erasable programmable ROM, electrically erasable programmable ROM, or the like. In one example, system memory 1110 includes random access memory (RAM), such as dynamic RAM (DRAM), synchronous DRAM, (SDRAM), double data rate SDRAM (DDR SDRAM) static RAM (SRAM), and the like. DSU 920 represents any storage device for software data, applications, and/or operating systems, but will most typically be a nonvolatile storage device. DSU 920 may optionally include one or more of an integrated drive electronic (IDE) hard disk, an enhanced IDE (EIDE) hard disk, a redundant array of independent disks (RAID), a small computer system interface (SCSI) hard disk, a serial advanced technology attachment (SATA or Serial ATA) and the like. Although DSU 1120 is illustrated as internal to processing system 1100, DSU 1120 may be externally coupled to processing system 1100. Communication link 1125 may couple processing system 1100 to a network such that processing system 1100 may communicate over the network with one or more other computers. Communication link 1125 may include a modem, an Ethernet card, a Gigabit Ethernet card, Universal Serial Bus (USB) port, a wireless network interface card, a fiber optic interface, or the like.

It should be appreciated that various other elements of processing system 1100 have been excluded from FIG. 11 and this discussion for the purpose of clarity. For example, processing system 1100 may further include a graphics card, additional DSUs, other persistent data storage devices (e.g., tape drive), and the like. Chipset 1130 may also include a system bus and various other data buses for interconnecting subcomponents, such as a memory controller hub and an input/output (I/O) controller hub, as well as, data buses (e.g., peripheral component interconnect bus) for connecting peripheral devices to chipset 1130. Moreover, processing system 1100 may operate without one or more of the elements illustrated. For example, processing system 1100 need not include DSU 1120.

The processes explained above are described in terms of computer software and hardware. The techniques described may constitute machine-executable instructions embodied within a machine (e.g., computer) readable medium, that when executed by a machine will cause the machine to perform the operations described. Additionally, the processes may be embodied within hardware, such as an application specific integrated circuit (ASIC) or the like.

A machine-accessible medium includes any mechanism that provides (i.e., stores and/or transmits) information in a form accessible by a machine (e.g., a computer, network device, personal digital assistant, manufacturing tool, any device with a set of one or more processors, etc.). For example, a machine-accessible medium includes recordable/non-recordable media (e.g., read only memory (ROM), random access memory (RAM), magnetic disk storage media, optical storage media, flash memory devices, etc.).

The above description of illustrated examples and embodiments of the disclosure, including what is described in the Abstract, is not intended to be exhaustive or to limit the disclosure to the precise forms disclosed. While specific embodiments of, and examples for, the disclosure are described herein for illustrative purposes, various modifications are possible within the scope of the disclosure, as those skilled in the relevant art will recognize.

These modifications can be made to the disclosure in light of the above detailed description. The terms used in the following claims should not be construed to limit the disclosure to the specific embodiments disclosed in the specification. Rather, the scope of the disclosure is to be determined entirely by the following claims, which are to be construed in accordance with established doctrines of claim interpretation.

What is claimed is:

1. A computer-implemented method, comprising:
    simulating, on a computer, a reference circuit design at a target crossover frequency, the reference circuit design representing a power supply circuit that includes a feedback stage to regulate an output of a power supply;
    determining, with the computer, an initial phase margin of the reference circuit design;
    adjusting, with the computer, a value of a gain limiter of the reference circuit design to limit a loop gain of the reference circuit design, wherein the gain limiter is a resistor and wherein adjusting the value of the gain limiter includes adjusting a value of the resistor and wherein an initial phase margin curve of the reference circuit design is substantially unaffected in response to adjusting the value of the gain limiter; and then
    adding, with the computer, an impedance network to the feedback stage in response to comparing the initial phase margin of the reference circuit design at the target crossover frequency with a threshold phase margin, the impedance network to increase the initial phase margin, wherein the impedance network is coupled in parallel with the gain limiter, and wherein adding the impedance network to the feedback stage further includes calculating a capacitance value of an impedance component of the impedance network in response to a value of the gain limiter.

2. The method of claim 1 further comprising calculating values of impedance components of the impedance network such that the reference circuit design operates at a resultant crossover frequency proximate to the target crossover frequency with a resultant phase margin greater than the initial phase margin.

3. The method of claim 2 wherein calculating values of the impedance components of the impedance network includes adding a pole and a zero to a transfer function of the reference circuit design, wherein the zero occurs substantially at the resultant crossover frequency and the pole occurs at least one decade higher than the target crossover frequency.

4. The method of claim 2 further comprising generating an output signal representative of a reference circuit design characteristic selected from the group consisting of the resultant crossover frequency, the resultant crossover phase margin, a phase response curve, and a magnitude response curve of the reference circuit design.

5. The method of claim 1 wherein setting the value of the gain limiter limits a loop gain of the reference circuit design to a gain of approximately one at the target crossover frequency.

6. The method of claim 1 wherein adding the impedance network includes adding a resistor-capacitor (RC) network in parallel to the gain limiter to increase a magnitude of the initial phase margin.

7. The method of claim 1 further comprising calculating values of feedback components included in the feedback stage to increase the phase margin of the reference circuit design at the target crossover frequency.

8. The method of claim 1 wherein the method is performed by a computer-aided-design (CAD) tool loaded with the reference circuit design and parameters of the reference circuit design.

9. The method of claim 1, wherein calculating the capacitance value of an impedance component of the impedance network comprises calculating the capacitance value in response to a value of the gain limiter and in response to the target crossover frequency.

10. A machine-accessible storage device that stores instructions that, if executed by a machine, will cause the machine to perform operations comprising:
    simulating a reference circuit design at a target crossover frequency, the reference circuit design representing a power supply circuit that includes a feedback stage to regulate an output of a power supply;
    determining an initial phase margin of the reference circuit design;
    adjusting a value of a gain limiter of the reference circuit design to limit a loop gain of the reference circuit design, wherein the gain limiter is a resistor and wherein adjusting the value of the gain limiter includes adjusting a value of the resistor and wherein an initial phase margin curve of the reference circuit design is substantially unaffected in response to adjusting the value of the gain limiter; and then
    adding an impedance network to the feedback stage in response to comparing the initial phase margin of the reference circuit design at the target crossover frequency with a threshold phase margin, the impedance network to increase the initial phase margin, wherein the impedance network is coupled in parallel with the gain limiter, and wherein adding the impedance network to the feedback stage further includes calculating a capacitance value of an impedance component of the impedance network in response to a value of the gain limiter.

11. The machine-accessible storage device of claim 10 further storing instructions that, if executed by the machine, will cause the machine to perform further operations, wherein setting the value of the gain limiter of the reference circuit design limits a loop gain of the reference circuit design to a gain of approximately one at the target crossover frequency.

12. The machine-accessible storage device of claim 11 wherein adding the impedance network includes adding a resistor-capacitor (RC) network in parallel to the gain limiter to increase a magnitude of the initial phase margin.

13. The machine-accessible storage device of claim 12 further storing instructions that, if executed by the machine, will cause the machine to perform further operations, comprising calculating values of impedance components of the RC network such that the reference circuit design operates at a resultant crossover frequency proximate to the target crossover frequency with a resultant phase margin greater than the initial phase margin.

14. The machine accessible storage device of claim 13 wherein calculating values of the impedance components of the RC network includes adding a pole and a zero to a transfer function of the reference circuit design, wherein the zero occurs substantially at the target crossover frequency and the pole occurs at least one decade higher than the target crossover frequency.

15. The machine-accessible storage device of claim 13 further storing instructions that, if executed by the machine, will cause the machine to perform further operations, comprising generating an output signal representative of a reference circuit design characteristic selected from the group consisting of the resultant crossover frequency, the resultant crossover phase margin, a phase response curve, and a magnitude response curve of the reference circuit design.

16. The machine-accessible storage device of claim 10 wherein the threshold phase margin is approximately equal to 45 degrees.

17. The machine-accessible storage device of claim 10, wherein calculating the capacitance value of an impedance component of the impedance network comprises calculating the capacitance value in response to a value of the gain limiter and in response to the target crossover frequency.

18. A system, comprising:
    a processor to execute instructions;
    random access memory (RAM) coupled to the processor to store the instructions; and
    a data storage unit (DSU) coupled to the processor and storing a computer-aided-design (CAD) tool that, if executed by the processor, will cause the processor to perform operations comprising:
        loading a reference circuit design from the DSU into the CAD tool, the reference circuit design representing a power supply circuit that includes a feedback stage to regulate an output of a power supply;
        simulating the reference circuit design at a target crossover frequency with the CAD tool;
        determining an initial phase margin of the reference circuit design;
        adjusting a value of a gain limiter of the reference circuit design to limit a loop gain of the reference circuit design, wherein the gain limiter is a resistor and wherein adjusting the value of the gain limiter includes adjusting a value of the resistor and wherein in an initial phase margin curve of the reference circuit design is substantially unaffected in response to adjusting the value of the gain limiter; and then
        adding an impedance network to the feedback stage in response to comparing the initial phase margin of the reference circuit design at the target crossover frequency with a threshold phase margin, the impedance network to increase the initial phase margin, wherein the impedance network is coupled in parallel with the gain limiter, and wherein adding the impedance network to the feedback stage further includes calculating a capacitance value of an impedance component of the impedance network in response to a value of the gain limiter.

19. The system of claim 18 wherein the gain limiter is a gain-limiting resister, the system further including instructions that when executed by the processor, cause the processor to perform operations including:
    setting a resistance value of the gain-limiting resistor included in the reference circuit design to limit a loop gain of the reference circuit design to approximately one;
    adding a resistor-capacitor (RC) network in parallel to the gain-limiting resistor; and
    calculating values of the RC network to increase the initial phase margin.

20. The system of claim 19 wherein calculating values of the RC network includes adding a pole and a zero to a transfer function of the reference circuit design, wherein the zero occurs substantially at the target crossover frequency and the pole occurs at least one decade higher than the target crossover frequency.

21. The system of claim 18 wherein the reference circuit design includes a power supply circuit design having a power stage coupled to the feedback stage.

22. The system of claim 21 wherein the power stage of the power supply circuit design includes an integrated circuit power supply controller coupled to a transformer.

23. The system of claim 18 wherein the CAD tool includes a graphical user interface (GUI) to allow a user of the CAD tool to input parameters of the reference circuit design selected from the group consisting of: circuit component values, the target crossover frequency, the threshold phase margin, and a target loop gain of the reference circuit design.

24. The system of claim 23 wherein the graphical user interface further includes a GUI window for displaying output data selected from the group consisting of a phase response curve, a magnitude response curve, a resultant crossover frequency at which a loop gain of the reference circuit design is approximately equal to one, and a resultant crossover phase margin of the reference circuit design calculated at the resultant crossover frequency.

25. The system of claim 18, wherein calculating the capacitance value of an impedance component of the impedance network comprises calculating the capacitance value in response to a value of the gain limiter and in response to the target crossover frequency.

* * * * *

UNITED STATES PATENT AND TRADEMARK OFFICE
CERTIFICATE OF CORRECTION

PATENT NO. : 7,624,360 B2 Page 1 of 1
APPLICATION NO. : 11/599524
DATED : November 24, 2009
INVENTOR(S) : Akselrod et al.

It is certified that error appears in the above-identified patent and that said Letters Patent is hereby corrected as shown below:

In Claim 18, Line 22 delete "in an initial" and replace with -- an initial --.

Signed and Sealed this

Tenth Day of August, 2010

David J. Kappos
*Director of the United States Patent and Trademark Office*

UNITED STATES PATENT AND TRADEMARK OFFICE
CERTIFICATE OF CORRECTION

PATENT NO. : 7,624,360 B2  Page 1 of 1
APPLICATION NO. : 11/599524
DATED : November 24, 2009
INVENTOR(S) : Akselrod et al.

It is certified that error appears in the above-identified patent and that said Letters Patent is hereby corrected as shown below:

Column 12, line 35 (Claim 18, Line 22) delete "in an initial" and replace with -- an initial --.

This certificate supersedes the Certificate of Correction issued August 10, 2010.

Signed and Sealed this

Thirty-first Day of August, 2010

David J. Kappos
*Director of the United States Patent and Trademark Office*